US008597742B2

(12) United States Patent
Sugiyama

(10) Patent No.: US 8,597,742 B2
(45) Date of Patent: Dec. 3, 2013

(54) PACKAGE

(75) Inventor: Takeshi Sugiyama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 99 days.

(21) Appl. No.: 13/165,065

(22) Filed: Jun. 21, 2011

(65) Prior Publication Data

US 2011/0250369 A1 Oct. 13, 2011

Related U.S. Application Data

(63) Continuation of application No. PCT/JP2009/053338, filed on Feb. 25, 2009.

(51) Int. Cl.
B32B 1/00 (2006.01)
B32B 1/02 (2006.01)
B32B 1/06 (2006.01)

(52) U.S. Cl.
USPC .......... 428/34.1; 428/34.4; 428/34.6

(58) Field of Classification Search
USPC ........... 428/34.1, 34.4, 34.5, 34.6, 34.7, 35.2, 428/35.3, 35.4, 35.7, 35.8, 35.9, 36.4, 36.6, 428/36.7
See application file for complete search history.

(56) References Cited

U.S. PATENT DOCUMENTS

| 6,877,216 B2* | 4/2005 | Fukuda et al. .................. 29/730 |
| 7,595,209 B1* | 9/2009 | Monadgemi et al. ........... 438/51 |
| 2005/0167795 A1* | 8/2005 | Higashi ......................... 257/678 |

FOREIGN PATENT DOCUMENTS

| JP | 07-154183 A | 6/1995 |
| JP | 08-084042 A | 3/1996 |
| JP | 2000-244274 A | 9/2000 |
| JP | 2002-121037 A | 4/2002 |
| JP | 2003-283289 A | 10/2003 |

OTHER PUBLICATIONS

International Search Report for International Application No. PCT/JP2009/053338, dated May 26, 2009, 2 pages.

* cited by examiner

*Primary Examiner* — Walter B Aughenbaugh
(74) *Attorney, Agent, or Firm* — Brinks Gilson & Lione

(57) ABSTRACT

A package includes a plurality of bonded substrates including a first substrate and a second substrate defining a cavity therebetween. A first bonding film resides on opposed surfaces of the first substrate and the second substrate so as to surround the cavity. The second bonding film surrounds the cavity and resides on the opposed surfaces of the first and second substrates adjacent to the first bonding film. The second bonding film has a bonding force stronger than the first bonding film and the ionization resistance of the first bonding film is greater than the ionization resistance of the second bonding film.

3 Claims, 8 Drawing Sheets

PACKAGE

RELATED APPLICATIONS

This application is a continuation of PCT/JP2009/053338 filed on Feb. 25, 2009. The entire content of this application is incorporated herein by reference.

BACKGROUND OF THE INVENTION

1. Field of the Invention

The present invention relates to a package, a method of manufacturing packages, and a method of manufacturing piezoelectric vibrators.

2. Description of the Related Art

In recent years, package products including a base substrate and a lid substrate anodically bonded to each other in a laminated state and formed with cavities formed therebetween and operating reeds mounted on the base substrate at portions positioned in the cavities are widely used. As a package product of this type, for example, a piezoelectric vibrator mounted in mobile phone sets or portable information terminal devices and using crystal or the like as a time instance source, a timing source for control signals or the like, and a reference signal source or the like, is known.

As a package in such a package product and a method of manufacturing the same, a package manufactured by laminating and bonding substrates is described, for example, in Patent Document 1. According to the package described in Patent Document 1, the interior of a space in the package can be hermetically sealed.

Also, in Patent Document 1, there is a description that metals such as aluminum, titanium, tantalum, silicon, and the like or semiconductors may be used as a bonded layer.
Patent Document 1: Japanese Patent No. 3621435

According to a package and a method of manufacturing the same described in Patent Document 1, the metals as described above or the semiconductors are used as the bonded layer, and packages are cut out along grooves formed at intermediate portions of the bonded layers in the width direction thereof. Therefore, the bonded layer is exposed from cut surfaces of the cut out packages.

However, with the package described in Patent Document 1, the bonded layer may be subject to corrosion when it comes in contact with an external environment, specifically, acid or alkali. For example, when the bonded layer is configured using aluminum having high bonding property, since aluminum oxide (alumina) in a film form is generated on the surface of the bonded layer exposed to atmospheric air normally in the atmospheric air, corrosion in the deep portion of the bonded layer is restrained. Here, in a case where atmospheric humidity is high, or in an environment in which the bonded layer comes into contact with acid solution, because of aluminum's readiness to be ionized, local battery is generated in the bonded layer, and hence the bonded layer is subjected to corrosion easily to the deep portion. If the bonded layer is subjected to corrosion, atmospheric air flows in through a gap thereof, and the interior of the package cannot be maintained in a predetermined environment any longer, thereby affecting the performance of the package product.

In order to restrict the corrosion of the bonded layer as described above, application of a coating which covers the bonded layer on an outer periphery of the package is known.

However, in order to apply such a coating, it is necessary to provide a specific step for applying a coating material. In addition, in order to ensure the coating of the bonded layer with the coating material and avoid the coating material from adhering to a portion such as an electrode, high degree of working accuracy is required.

Also, when configuring the bonded layer while assigning a priority to having a high corrosion-resistant property, an insufficient bonding property between the substrates may be resulted, and also quality maintenance of the package product may become difficult.

SUMMARY OF THE INVENTION

In view of circumstances described above, it is an object of the present invention to provide a package achieving both a bonding property between substrates and a corrosion-resistant property.

Also, it is a second object of the present invention to provide a method of manufacturing packages which can manufacture packages achieving both a bonding property between substrates and a corrosion-resistant property efficiently, and a method of manufacturing a piezoelectric vibrator.

A package according to the present invention is a package formed by bonding a plurality of substrates including a first substrate and a second substrate and forming a cavity between the plurality of substrates, and is characterized by including a corrosion-resistant bonding film arranged on opposed surfaces of the first substrate and the second substrate so as to surround the cavity, and a high-bonding-property bonding film arranged on the opposed surfaces of the first substrate and the second substrate inward of the corrosion-resistant bonding film and having a bonding force stronger than the corrosion-resistant bonding film.

According to this invention, in the state in which the first substrate and the second substrate are bonded, the corrosion-resistant bonding film is exposed to the outside of the package on the opposed surfaces of the first substrate and the second substrate, and the high-bonding-property bonding film is exposed on the side of the cavity. Therefore, the high-bonding-property bonding film is restrained from being exposed to the outside by the corrosion-resistant bonding film, and hence is restrained from being exposed to atmospheric air, acid solution, alkali solution or the like in the outside of the package. By the bonding film giving priority to bonding property and the bonding film giving priority to corrosion-resistant property combined to each other in the positional relationship described above, both of the bonding strength and the corrosion-resistant property of the package can be achieved.

Also, according to the package of the present invention, it is preferable that the high-bonding-property bonding film contains aluminum.

In this case, since the corrosion of the high-bonding-property bonding film is restrained by the corrosion-resistant bonding film, aluminum can be selected as the high-bonding-property bonding film by putting a premium on the bonding property without considering the corrosion-resistant property. Although aluminum is a material having a high readiness to be ionized and has a property to be dissolved when acid solution or the like is adhered thereto in a state of being in contact with metal of a different types, corrosion is restricted because it is protected from the external environment of the package by the corrosion-resistant bonding film. By employing aluminum, the bonding property between the first substrate and the second substrate is enhanced, and the sealing of the cavity can be ensured.

Also, according to the package of the present invention, it is preferable that the first substrate and the second substrate contain glass, the corrosion-resistant bonding film includes: a chrome layer arranged so as to come into contact with the surface of the first substrate, and a silicon layer arranged so as to come into contact with the chrome layer and the second substrate.

In this case, both the first substrate and the second substrate are glass-based substrates, and the chrome layer is arranged on the first substrate. The chrome layer has a high adhesiveness with respect to glass, and can be formed as a desired pattern easily on the glass-based first substrate. Also, since the silicon layer is formed between the chrome layer and the second substrate, the chrome layer and the silicon layer are metals and firmly bonded to each other, and the silicon layer and the glass-based second substrate are bonded suitably by anode bonding.

A method of manufacturing packages according to the present invention is a method of manufacturing a package formed by bonding a plurality of substrates including a first substrate and a second substrate and forming a cavity between the plurality of substrates, characterized by including: a first wafer forming step for forming a first wafer formed integrally with a plurality of the first substrates; a second wafer forming step for forming a second wafer formed integrally with a plurality of the second substrates in a positional relationship which enables superimposition with the first substrates; a first step for forming a first bonding film in a band shape having at least a predetermined width and having a predetermined thickness on the surface of the first wafer so as to surround the cavity; a removing step for removing an intermediate portion of the first bonding film in the width direction into a band shape narrower than the predetermined width to form a groove portion from which the surface of the first wafer is exposed subsequent to the first step; a second step for forming a corrosion-resistant bonding film having a less readiness to be ionized than the first bonding film and having the predetermined thickness on the surface of the first wafer exposed in the groove portion subsequent to the removing step; a bonding step for bonding the first wafer and the second wafer in superimposition one another so as to interpose the first bonding film and the corrosion-resistant bonding film; and a dicing step for cutting the bonded member including the first wafer and the second wafer bonded to each other at the intermediate portion of the corrosion-resistant bonding film in the width direction subsequent to the bonding step.

According to this invention, the band-shaped first bonding film is formed in the first step and the groove portion is formed at the intermediate portion of the first bonding film in the width direction in the subsequent removing step. Subsequently, when the corrosion-resistant bonding film is formed along the groove portion in the second step, the order of arrangement of the cavity and the bonding film on the first wafer is a repeated in the order of the cavity, the first bonding film, the corrosion-resistant bonding film, the first bonding film in this order. Subsequently, since the intermediate portion of the corrosion-resistant bonding film in the width direction is cut in the dicing step, the first bonding film is positioned inward of the corrosion-resistant bonding film, and development of the corrosion can be restricted by the corrosion-resistant bonding film.

Also, a method of manufacturing piezoelectric vibrators according to the present invention is a method of manufacturing a piezoelectric vibrator formed by bonding a plurality of substrates including a first substrate and a second substrate and forming cavities between the plurality of substrates, characterized by including: a first wafer forming step for forming a first wafer formed integrally with a plurality of the first substrates; a second wafer forming step for forming a second wafer formed integrally with a plurality of the second substrates in a positional relationship which enables superimposition with the first substrates; a wiring step for forming a plurality of wirings having a predetermined circuit shape for the first substrate on the surface of the first wafer; a first step for forming a first bonding film in a band shape having at least a predetermined width and having a predetermined thickness on the surface of the first wafer so as to surround the cavity; a removing step for removing an intermediate portion of the first bonding film in the width direction into a band shape narrower than the predetermined width to form a groove portion from which the surface of the first wafer is exposed subsequent to the first step; a second step for forming a corrosion-resistant bonding film having a less readiness to be ionized than the first bonding film and having the predetermined thickness on the surface of the first wafer exposed in the groove portion subsequent to the removing step; a connecting step for connecting piezoelectric vibration reeds to the wirings subsequent to the second step; a bonding step for bonding the first wafer and the second wafer in superimposition one another so as to interpose the first bonding film and the corrosion-resistant bonding film; a dicing step for cutting the bonded member including the first wafer and the second wafer bonded to each other at the intermediate portion of the corrosion-resistant bonding film in the width direction subsequent to the bonding step.

According to this invention, the first bonding film is positioned inward of the corrosion-resistant bonding film, and development of the corrosion can be restricted by the corrosion-resistant bonding film. Therefore, hermeticity in the cavity is ensured, and the stable operation of the piezoelectric vibration reed arranged in the cavity is maintained irrespective of the external environment of the piezoelectric vibrator.

According to the package of the present invention, both of the bonding property between the substrates and the corrosion-resistant property are achieved.

Also, according to the method of manufacturing packages of the present invention, the packages which can achieve both of the bonding property between the substrates and the corrosion-resistant property can be manufactured efficiently.

Also, according to the method of manufacturing the piezoelectric vibrators of the present invention, the piezoelectric vibrator which can achieve both of the bonding property between the substrates and the corrosion-resistant property efficiently and maintain the stable operation of the piezoelectric vibration reed irrespective of the external environment of the piezoelectric vibrator can be manufactured efficiently.

DETAILED DESCRIPTION OF THE PREFERRED EMBODIMENTS

Referring now to FIG. 1 to FIG. 5, a package and a method of manufacturing packages according to an embodiment of the present invention will be described.

Figure 1:
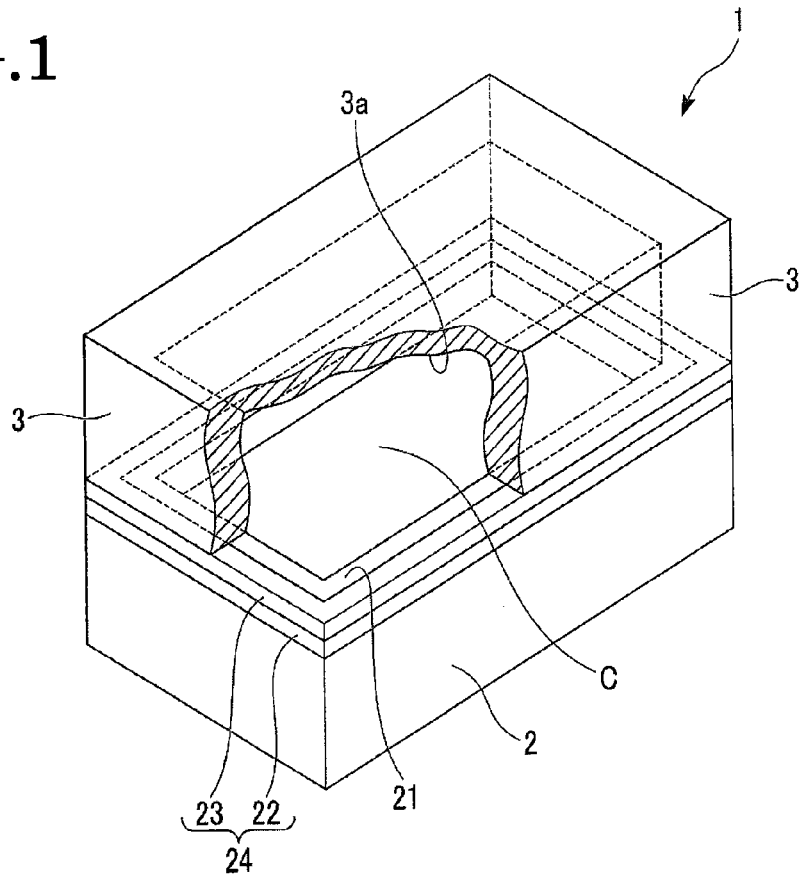
FIG. 1 is a perspective view showing a package according to an embodiment of the present invention.

FIG. 1 is a perspective view of a package 1, partly broken, according to this embodiment. As shown in FIG. 1, the package 1 includes a plurality of substrates including a base substrate 2 (first substrate) and a lid substrate 3 (second substrate) bonded to each other, and a cavity C is defined between the base substrate 2 and the lid substrate 3.

In this embodiment, the base substrate 2 and the lid substrate 3 are both glass-based substrates containing glass material and, more specifically, a glass substrate formed of soda lime glass, for example, may be employed.

In addition, formed on opposed surfaces of the base substrate 2 and the lid substrate 3 are corrosion-resistant bonding film 24 arranged so as to surround the cavity C and a high-bonding-property bonding film 21 arranged inward of the corrosion-resistant bonding film 24.

The high-bonding-property bonding film 21 and the corrosion-resistant bonding film 24 are both a bonding film for bonding the base substrate 2 and the lid substrate 3. The high-bonding-property bonding film 21 is a bonding film employed in view of priority of strength of the bonding force for bonding the base substrate 2 and the lid substrate 3 and, in this embodiment, a metallic material containing aluminum may be employed.

Also, either aluminum alloy or simple aluminum may be employed as the high-bonding-property bonding film 21. In addition, for example, titanium or other metallic material, or semiconductor materials may be employed as the high-bonding-property bonding film 21 instead of aluminum, and optimum materials for enhancing the bonding force may be selected and employed preferably depending on components of the base substrate 2 and the lid substrate 3, respectively.

The corrosion-resistant bonding film 24 is a bonding film having a corrosion-resistant property higher than that of the high-bonding-property bonding film 21. In this embodiment, a bonding film higher in corrosion-resistant property under the acid or alkali conditions is selected and employed, so that a material which is low in rate of dissolution in comparison with that of the high-bonding-property bonding film 21 if acid solution or alkaline solution is adhered thereto is included.

The corrosion-resistant bonding film 24 in this embodiment has a two-layer structure including a chrome layer 22 arranged so as to come into contact with the surface of the base substrate 2 and a silicon layer 23 arranged so as to come into contact with the chrome layer 22 and the lid substrate 3.

The chrome layer 22 has a high adhesiveness with respect to the base substrate 2, which contains chrome and is a glass-based substrate. Also, the silicon layer 23 has a high bonding property via anode bonding with respect to the lid substrate 3, which contains silicone and is a glass-based substrate.

In this embodiment, the corrosion-resistant bonding film 24 having the chrome layer 22 and the silicon layer 23 has a less readiness to be ionized than the high-bonding-property bonding film 21 containing aluminum. Therefore, even in the environment in which aluminum is subject to corrosion easily under the acid or alkali conditions, the high-bonding-property bonding film 21 is surround by the corrosion-resistant bonding film 24 which contains chrome and silicon and is protected from exposure to the acid or alkali environment.

For reference sake, the combination of the high-bonding-property bonding film 21 and the corrosion-resistant bonding film 24 may be other combinations which satisfy the above-described relationship in terms of the degree of readiness to be ionized. Also, focusing attention on factors other than the readiness to be ionized, materials which is less corrosive in an accelerated test or the like to be conducted under various conditions of external environments to which the corrosion-resistant bonding film 24 is exposed may be selected and employed as the corrosion-resistant bonding film 24.

Also, both of the high-bonding-property bonding film 21 and the corrosion-resistant bonding film 24 are formed to have the same thickness in the direction vertical to the surface of the base substrate 2, and both of the high-bonding property bonding film 21 and the corrosion-resistant bonding film 24 are tightly adhered to the lid substrate 3.

Therefore, in the package 1, the cavity C is hermetically sealed by the high-bonding-property bonding film 21 and the corrosion-resistant bonding film 24. Also, various circuits such as a sensor circuit or an oscillation circuit may be configured in the interior of the cavity C, and a configuration in which the interior of the cavity C is sealed in a vacuum state may also be employed.

Figure 3A:
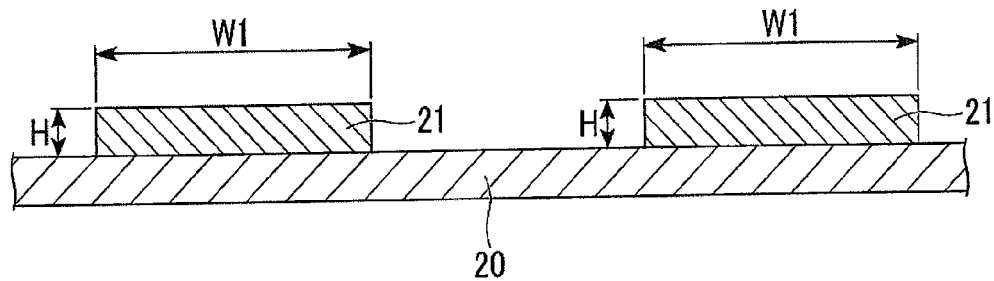
FIG. 3A is a cross-sectional view showing a process of the method of manufacturing the same packages.
Figure 3B:
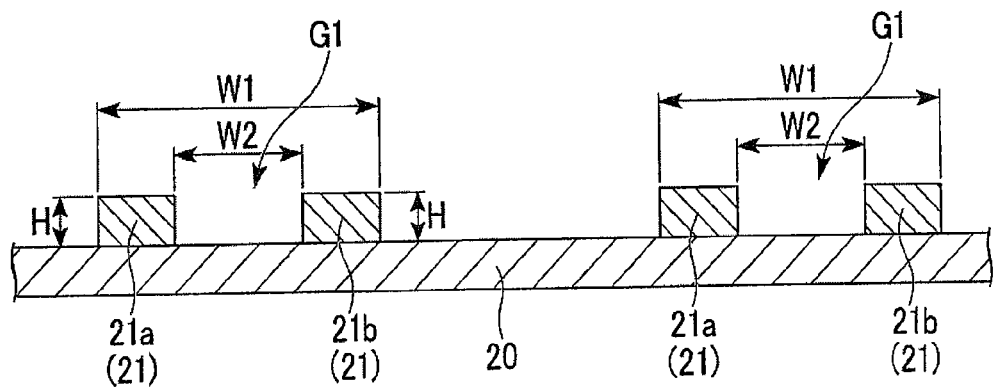
FIG. 3B is a cross-sectional view showing a process of the method of manufacturing the same packages.
Figure 3C:
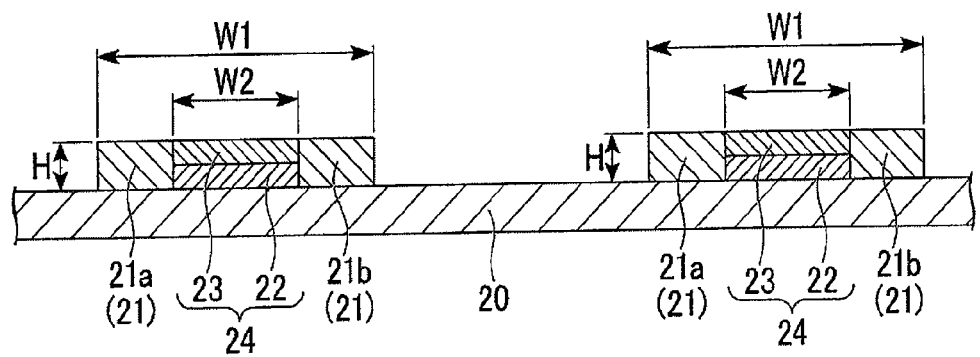
FIG. 3C is a cross-sectional view showing a process of the method of manufacturing the same packages.
Figure 4A:
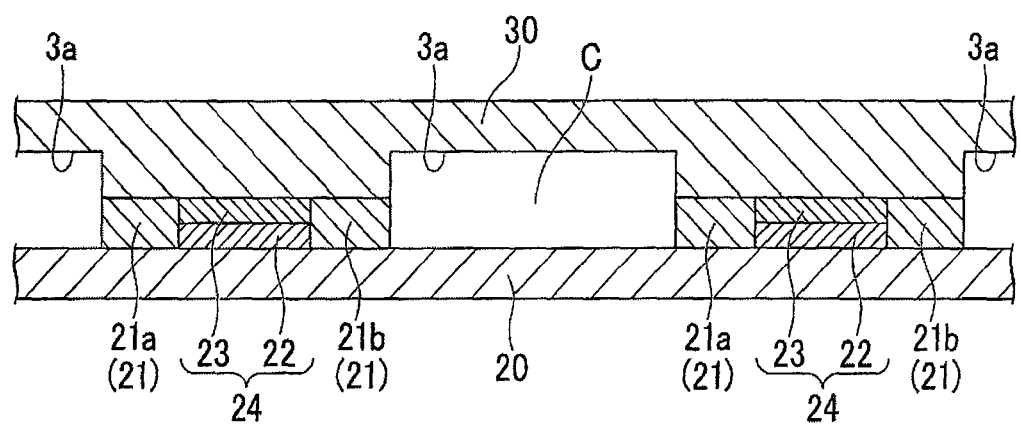
FIG. 4A is a cross-sectional view showing a process of the method of manufacturing the same packages.
Figure 4B:
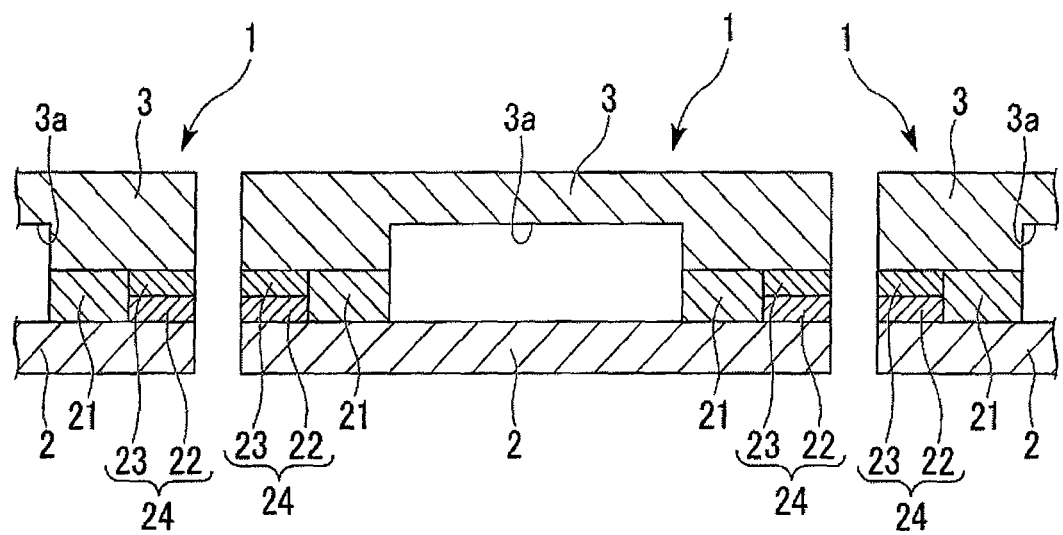
FIG. 4B is a cross-sectional view showing a process of the method of manufacturing the same packages.
Figure 5:
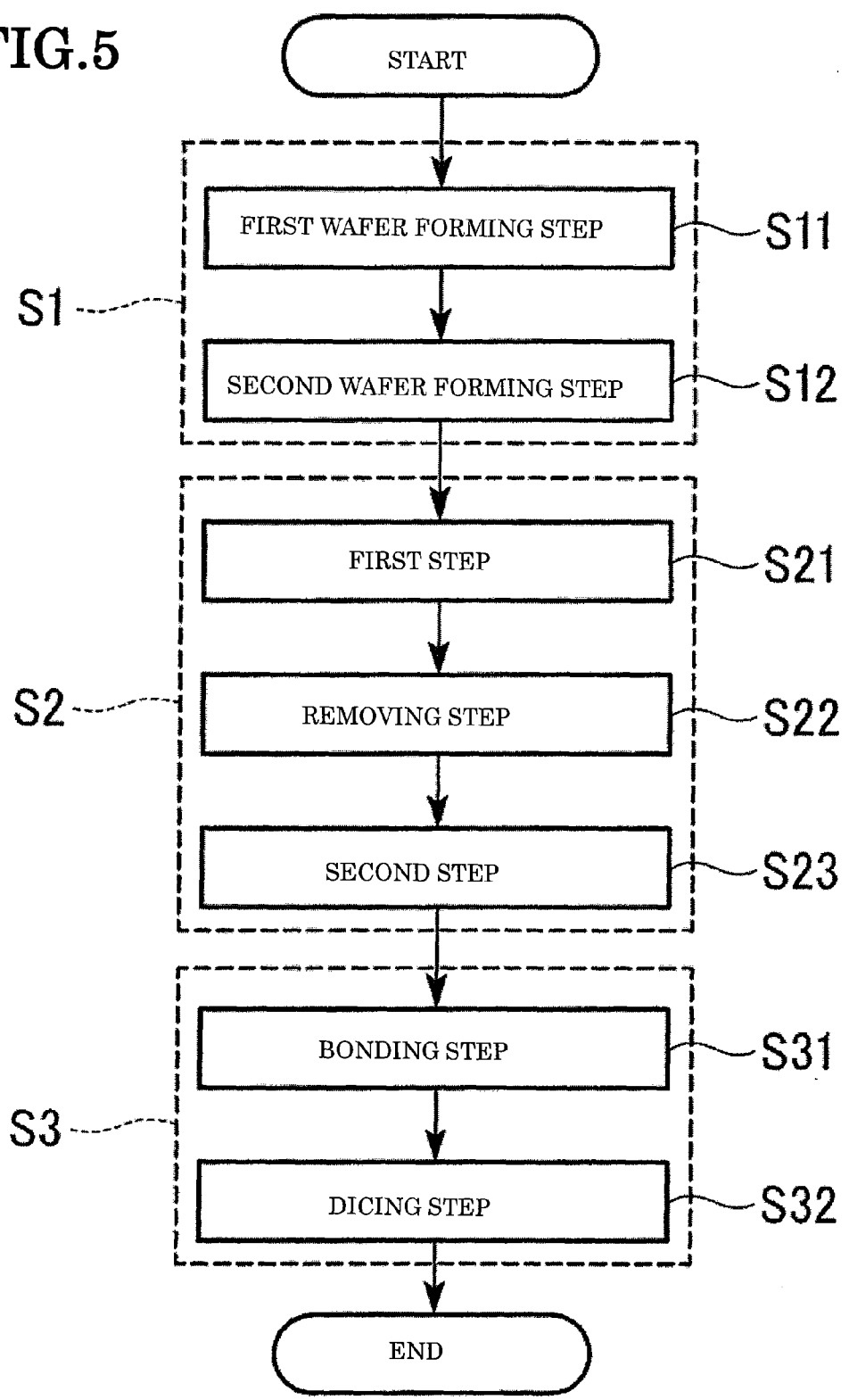
FIG. 5 is a flowchart showing the method of manufacturing the same package.

Referring now to FIG. 2A to FIG. 5, a method of manufacturing packages according to this embodiment will be described. FIG. 2A to FIG. 4B are cross-sectional views showing a method of manufacturing the package 1, and FIG. 5 is a flowchart showing the method of manufacturing the packages 1.

First of all, the method of manufacturing packages according to this embodiment will be described in brief. In the method of manufacturing packages according to this embodiment, a plurality of packages 1 are manufactured at once by bonding a base wafer 20 (first wafer) which is an original of the base substrates 2 and a lid wafer 30 which is an original of the lid substrates 3.

Figure 2A:
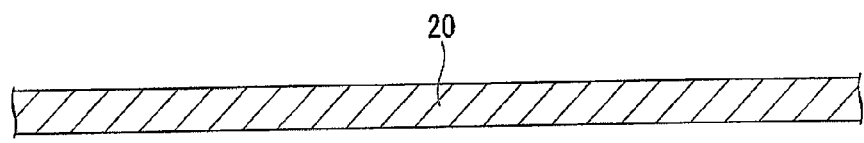
FIG. 2A is a cross-sectional view showing a process of manufacturing in a method of manufacturing packages according to the embodiment of the present invention.
Figure 2B:
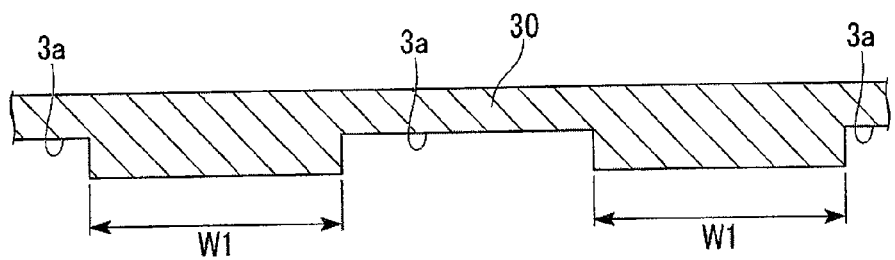
FIG. 2B is a cross-sectional view showing a process of the method of manufacturing the same packages.

FIG. 2A and FIG. 2B are cross-sectional views showing a process of manufacturing of the packages 1, and show a wafer forming step S1 (see FIG. 5) of forming the base wafer 20 and the lid wafer 30 into a predetermined shape. FIG. 2A shows the base wafer 20. Although not illustrated in detail, the base wafer 20 is molded to a shape having a plurality of the base substrates 2 formed integrally therewith through punching or wiring or the like (first wafer forming step S11, see FIG. 5). Also, FIG. 2B shows the lid wafer 30. The lid wafer 30 is formed with depressed portions 3a at positions which become the cavities C after having completed manufacture of the packages 1, and is formed with bonding areas having a predetermined width W1 so as to partition the depressed portions 3a. In this manner, the lid wafer 30 is molded into a shape in which a plurality of the lid substrates 3 are integrally molded (second wafer forming step S12, see FIG. 5).

FIG. 3A to FIG. 3C are cross-sectional views showing a process of manufacturing the packages 1, and show a bonding film forming step S2 (see FIG. 5) for forming the high-bonding-property bonding films 21 and the corrosion-resistant bonding films 24 into a predetermined shape. As shown in FIG. 3A, in the bonding film forming step S2, first of all, the first bonding films 21 (the high-bonding-property bonding film 21 described above) having a band shape with the predetermined width W1 and a predetermined thickness H are formed at positions on the surface of the base wafer 20 corresponding to the bonding areas having the predetermined width W1 on the lid wafer 30 (first step S21, see FIG. 5). A spattering method may be employed as a method of forming the first bonding films 21. In the first step S21, the first bonding films 21 surrounding the areas which become the cavities C when the manufacture of the packages 1 is completed are formed on the surface of the first wafer 20. The areas which become the cavities C are arranged at a plurality of positions on the wafers (base wafer 20, lid wafer 30), and the first bonding films 21 are formed into a grid shape on the base wafer 20.

Subsequently, as shown in FIG. 3B, subsequent to the first step S21, portions of the first bonding films 21 are removed in a band shape having a width W2 narrower than the predetermined width W1 at intermediate portions in the width direction thereof to form groove portions G1 in which the surface of the base wafer 20 is exposed (removing step S22, see FIG. 5). The groove portions G1 are formed along centerlines of the first bonding films 21 and divide the first bonding films 21 into high-bonding-property bonding films 21a, 21b. For reference sake, the width W2 of the groove portion G1 is preferably half or less the predetermined width W1 of the first bonding film 21. It is for securing a wider width of the high-bonding-property bonding films 21 in order to ensure bonding between the base substrates 2 and the lid substrates 3 after having completed manufacture of the packages 1.

As shown in FIG. 3C, subsequent to the removing step S22, the corrosion-resistant bonding films 24 having a less readiness to be ionized than the high-bonding-property bonding film 21 as described above are formed on the surface of the base wafer 20 exposed from the groove portions G1 (second step S23, see FIG. 5). In the second step S23, first of all, they are formed by laminating the chrome layers 22 on the base wafer 20, and then laminating the silicon layers 23 on the upper surface of the chrome layers 22. The same method as the method of forming the first bonding films 21 (spattering method) may be employed for the formation of the corrosion-resistant bonding films 24. For reference sake, employing the same method as the method for forming the first bonding films 21 (the high-bonding-property bonding films 21) and the corrosion-resistant bonding films 24 has an effect of simplification of the manufacturing method. However, the method of forming the high-bonding-property bonding films 21 and the method of forming the corrosion-resistant bonding films 24 may be different.

The thickness of the corrosion-resistant bonding films 24 is preferably the same as the predetermined thickness H of the high-bonding-property bonding films 21. For reference sake, the respective thicknesses of the chrome layer 22 and the silicon layer 23 may be selected arbitrarily so that the sum of these thicknesses becomes the predetermined thickness H.

For reference sake, although FIG. 3C shows a state in which the groove portions G1 are filled with the corrosion-resistant bonding films 24 entirely, there may be a gap between the corrosion-resistant bonding films 24 and the high-bonding-property bonding films 21.

FIG. 4A and FIG. 4B are cross-sectional views showing a process of manufacturing of the packages 1, and show a package forming step S3 (see FIG. 5) for bonding the base wafer 20 and the lid wafer 30 and then dividing into packages. As shown in FIG. 4A, after having completed the second step S23, the base wafer 20 and the lid wafer 30 are superimposed one another so as to interpose the first bonding film (high-bonding-property bonding film 21) and the corrosion-resistant bonding film 24 therebetween and are bonded (bonding step S31, see FIG. 5).

In this embodiment, the bonding step S31 is performed by the anode bonding method, and first of all, the base wafer 20 and the lid wafer 30 superimposed one another are pressed in the direction of compression thereof. Subsequently, a predetermined DC voltage is applied with the base wafer 20 on the anode side and the lid wafer 30 on the cathode side. Then, the high-bonding-property bonding film 21 and the silicon layer 23 are anodically bonded with respect to the lid wafer 30 respectively, and the cavities C, which are voids, are generated between the base wafer 20 and the lid wafer 30.

As shown in FIG. 4B, after having completed the bonding step S31, the bonded member obtained by bonding the base wafer 20 and the lid wafer 30 is cut at intermediate portions of the corrosion-resistant bonding films 24 in the width direction thereof (dicing step S32, see FIG. 5). In the dicing step S32, the bonded member of the base wafer 20 and the lid wafer 30 is cut so as to include one each of the cavities C, thereby obtaining a plurality of the packages 1.

As described thus far, according to the package 1 in this embodiment, the base substrate 2 and the lid substrate 3 are reliably bonded by the high-bonding-property bonding film 21. In addition, the high-bonding-property bonding film 21 is restrained from being exposed to the outside of the package 1 by the corrosion-resistant bonding film 24, and hence is restrained from being exposed to atmospheric air, acid solution, alkali solution or the like on the outside of the package 1. Therefore, both the bonding strength and the corrosion-resistant property in the package are achieved.

Also, since the corrosion of the high-bonding-property bonding film 21 is restrained by the corrosion-resistant bonding film 24, aluminum can be selected as the high-bonding-property bonding film 21 by putting a premium on the bonding property without considering the corrosion-resistant property. Since the material containing aluminum is employed as the high-bonding-property bonding film 21, the base substrate 2 and the lid substrate 3, which are glass-based substrate can be bonded firmly, so that the cavity C is reliably sealed.

Also, according to the method of manufacturing packages in this embodiment, the high-bonding-property bonding films 21 are firstly formed in the steps from the first step S21 to the second step S23, and then the intermediate portions of the high-bonding-property bonding films 21 in the width direction are formed so as to be replaced with the corrosion-resistant bonding films 24. Therefore, a configuration in which corrosion of the bonding films is prevented can be completed in a state in which the base substrates 2 and the lid substrates 3 are both in the wafer state. Therefore, the high-bonding-property bonding films 21 are reliably protected by the corrosion-resistant bonding films 24 already when they are cut into individual packages 1.

Also, since the configuration for preventing the corrosion of the bonding film is completed in the stage of the wafer as described above, it is no longer necessary to cover the bonding films exposed to the outside surfaces of the packages 1 individually as in the related art. Consequently, the packages can be manufactured efficiently.

Subsequently, referring now to FIG. 6 to FIG. 9, a method of manufacturing piezoelectric vibrators according to an embodiment of the present invention will be described. For reference sake, in the respective embodiments described below, the same reference numerals are designated to portions common to the method of manufacturing packages described above, and description thereof will be omitted.

Figure 6:
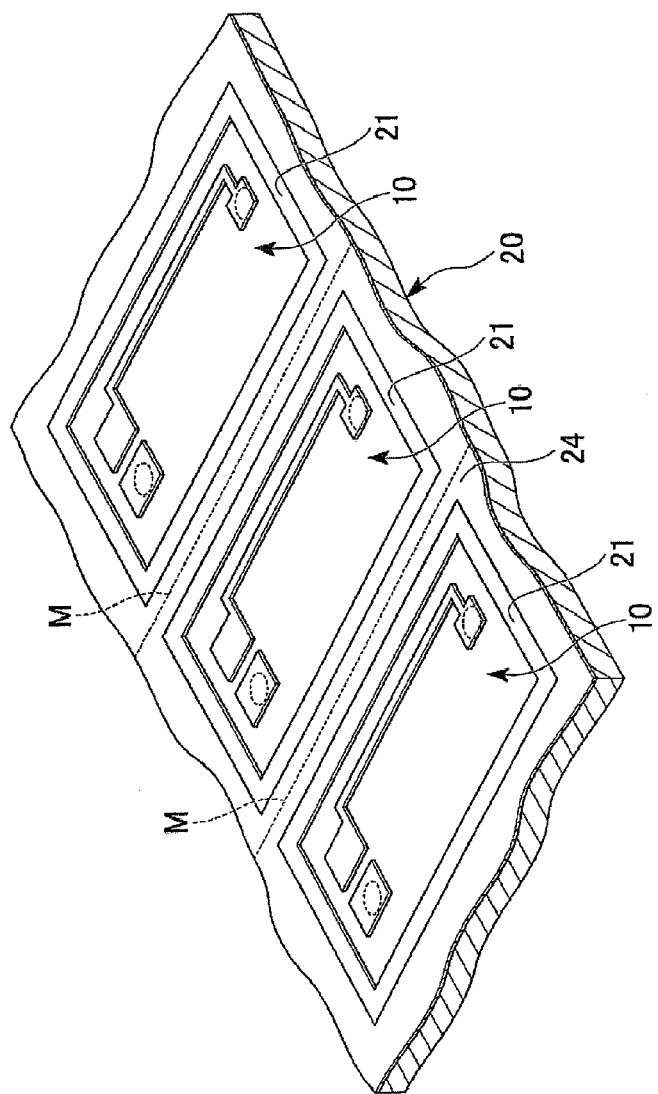
FIG. 6 is a perspective view showing a process in a method of manufacturing piezoelectric vibrators according to an embodiment of the present invention.
Figure 7:
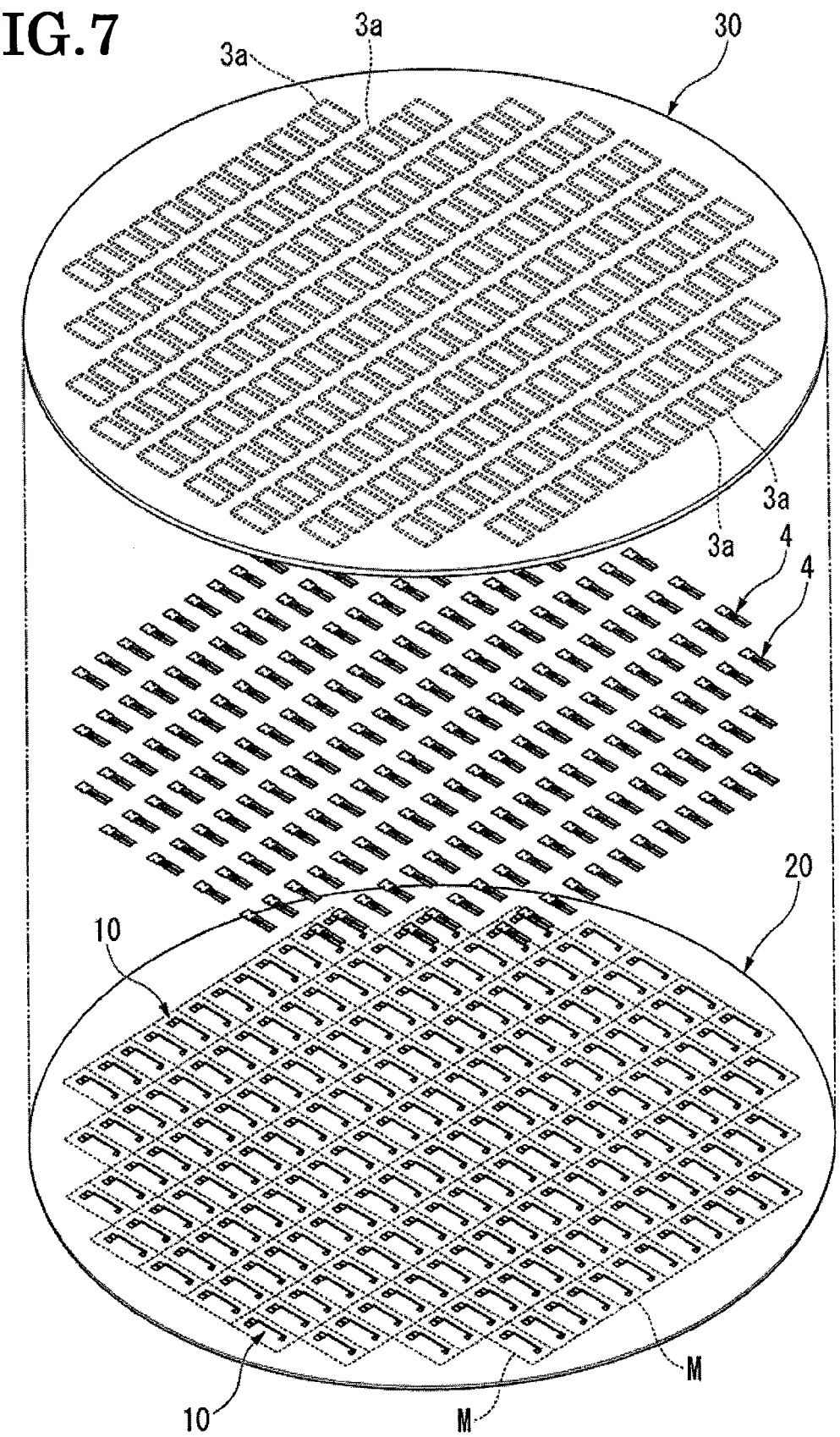
FIG. 7 is a perspective view showing a process in the method of manufacturing the same piezoelectric vibrators.

FIG. 6 and FIG. 7 are perspective views showing a process of manufacture in the method of manufacturing piezoelectric vibrators according to this embodiment. In addition, FIG. 8 is a perspective view of the piezoelectric vibrator, partly broken, according to this embodiment.

Figure 8:
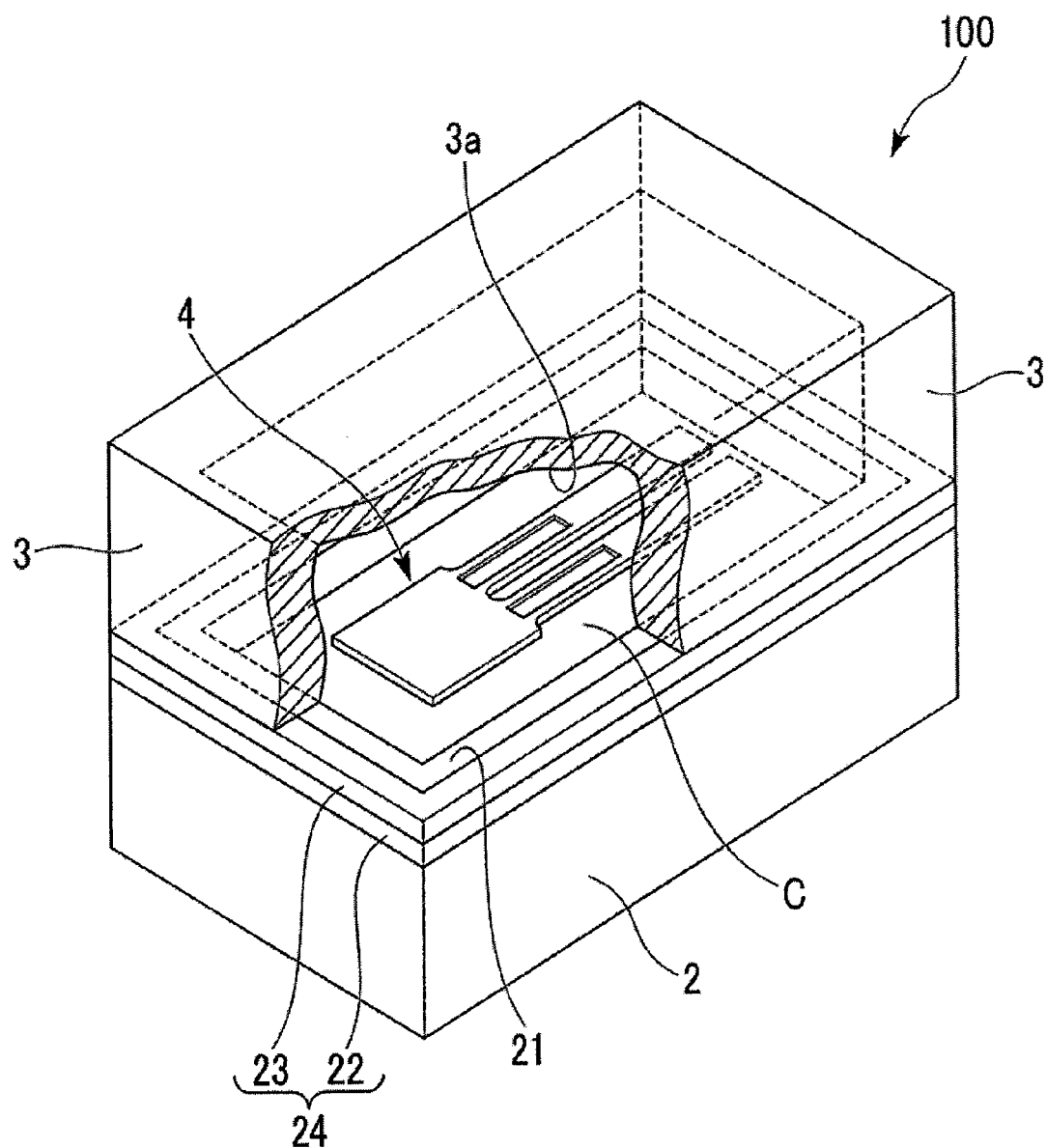
FIG. 8 is a perspective view showing the partly broken piezoelectric vibrator manufactured according to the method of manufacturing the same piezoelectric vibrator.

As shown FIG. 8, a piezoelectric vibrator 100 in this embodiment includes a piezoelectric vibration reed 4 arranged in the cavity C of the package, which is equivalent to the package shown in FIG. 1. The piezoelectric vibrator 100 is configured to oscillate at a predetermined frequency by the piezoelectric vibration reed 4 being energized.

The method of manufacturing piezoelectric vibrator 100 will be described in detail below.

Figure 9:
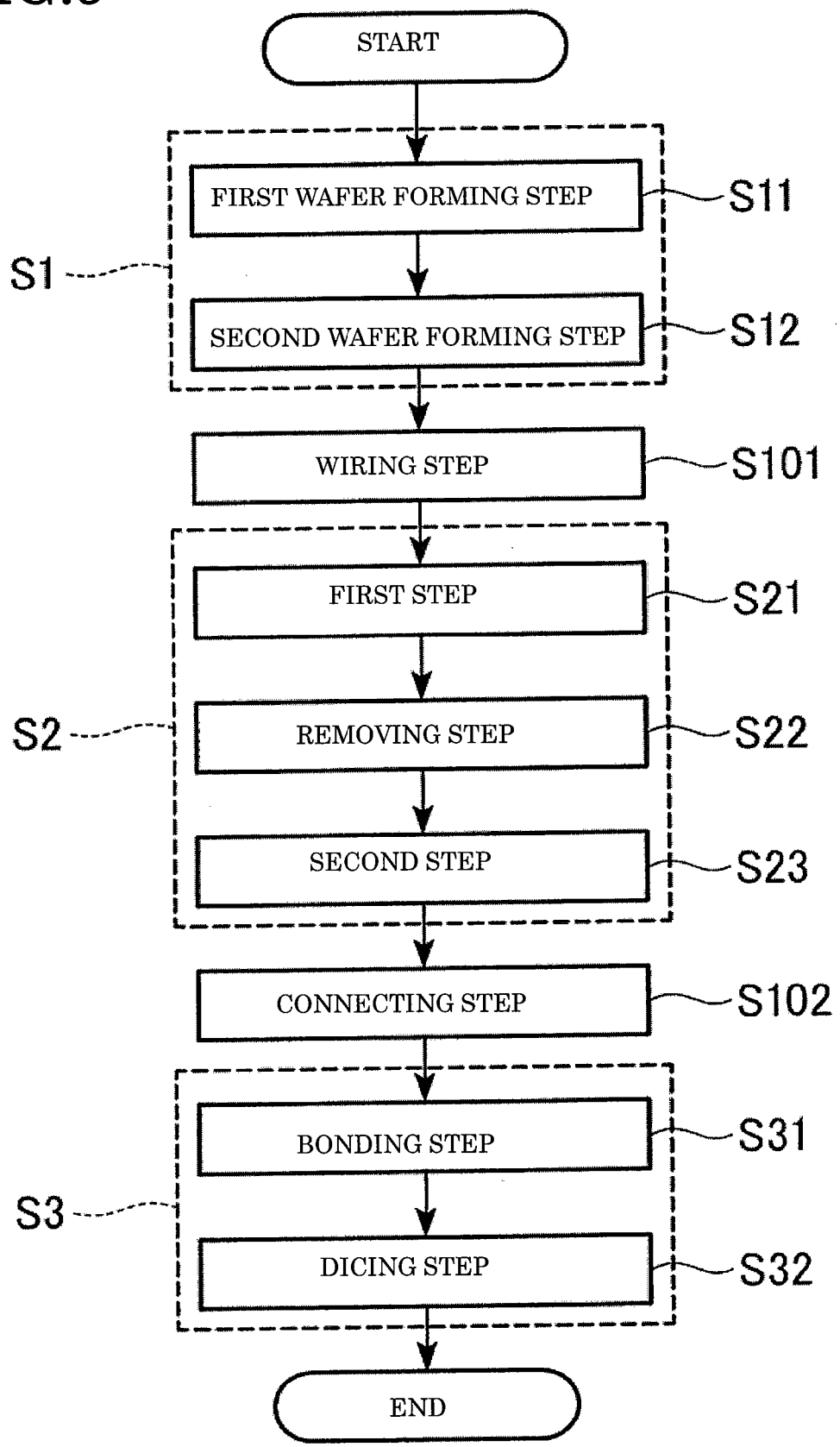
FIG. 9 is a flowchart showing the method of manufacturing the same piezoelectric vibrator.

FIG. 9 is a flowchart showing the method of manufacturing the piezoelectric vibrator 100. As shown in FIG. 9, in the method of manufacturing the piezoelectric vibrators in this embodiment, a wiring step S101 and a connecting step S102 are additionally provided in the method of manufacturing the package described above.

The wiring step S101 is a step of forming a wire circuit 10 in areas surrounded by the high-bonding-property bonding films 21, that is, insides the cavities C as shown in FIG. 6. The wire circuit 10 includes an electrode which communicates to the outside surface of the package 1.

The connecting step S102 is a step of electrically connecting the piezoelectric vibration reed 4 with respect to the wire circuit 10 formed on the surface of the base wafer 20 in the wiring step S101 as shown in FIG. 7. Although not illustrated in detail, a vibration reed having a tuning fork formed of piezoelectric material such as crystal, lithium tantalite, or lithium niobate for example, and configured to vibrate when a predetermined voltage is applied thereto may be employed as the piezoelectric vibration reed 4.

In addition, the same bonding step S31 as described above is performed subsequent to the connecting step S102, so that the base wafer 20 to which the piezoelectric vibration reeds 4 are connected and the lid wafer 30 are bonded to each other.

By the dicing step S32 performed after the bonding step S31, the piezoelectric vibrators 100 each including the piezoelectric vibration reed 4 sealed hermetically therein are cut into individual pieces and completed.

In this manner, according to the method of manufacturing the piezoelectric vibrators in this embodiment, the high-bonding-property bonding film 21 are reliably protected by the corrosion-resistant bonding films 24 already when they are cut into individual piezoelectric vibrators as in the above-described method of manufacturing packages. Therefore, hermeticity in the cavity is ensured, and the stable operation of the piezoelectric vibration reed arranged in the cavity is maintained irrespective of the external environment of the piezoelectric vibrator.

Although the embodiments of the present invention have been described in detail referring to the drawings, detailed configurations are not limited to these embodiments, and modifications in design or the like without departing the scope of the present invention are also included.

The package according to the present invention is, in the packages formed by bonding a plurality of the substrates and forming cavities between the plurality of substrates, preferably applicable for maintaining the hermeticity of the cavities under the environment in which the bonding films are subject to corrosion, and maintaining the stable operation of the operating reeds arranged in the interiors of the cavities.

What is claimed is:

1. A package including a plurality of substrates including a first substrate and a second substrate joined by a bond and defining a cavity therebetween, the package comprising:
    a first bonding film contacting opposed surfaces of the first substrate and the second substrate and surrounding the cavity and bonding the first substrate and second substrate; and
    a second bonding film surrounding the cavity and having first and second sides respectively contacting the opposed surfaces of the first substrate and the second substrate, the second bonding film adjacent to the first bonding film and contacting a first side of the first bonding film and having a third side, opposite to the first side of the first bonding film that is exposed to the cavity, and bonding the first substrate and second substrate,
    wherein the ionization resistance of the first bonding film is greater than the ionization resistance of the second bonding film.

2. The package according to claim 1, wherein the second bonding film includes aluminum.

3. The package according to claim 1, wherein
    the first substrate and the second substrate contain glass,
    the first bonding film includes:
    a chrome layer in contact with the surface of the first substrate, and
    a silicon layer in contact with the chrome layer and the second substrate.

\* \* \* \* \*